United States Patent [19]

Owensby

[11] Patent Number: 4,693,323
[45] Date of Patent: Sep. 15, 1987

[54] FLEXIBLE ELECTROMAGNETIC PULSE SHIELDING CONDUIT

[76] Inventor: Max T. Owensby, 8116 Deering Ave., Canoga Park, Calif. 91304

[21] Appl. No.: 830,201

[22] Filed: Feb. 18, 1986

[51] Int. Cl.[4] .......................... H05K 9/00; H02G 3/04; F16L 33/20
[52] U.S. Cl. .............................. 174/35 C; 174/68 C; 174/78; 285/149
[58] Field of Search .............. 174/35 C, 35 SM, 68 C, 174/78; 339/13, 14 L, 15, 143 R; 361/215; 29/421 M; 285/149

[56] References Cited

U.S. PATENT DOCUMENTS

| 2,287,134 | 6/1942 | Robertson | 174/35 C X |
| 2,577,049 | 12/1951 | Uline | 174/35 C |
| 3,313,536 | 4/1967 | Dutton et al. | 29/421 M X |
| 3,889,046 | 6/1975 | Oberdiear | 285/149 X |
| 3,992,773 | 11/1976 | Duffner et al. | 29/421 M X |
| 4,376,548 | 3/1983 | Armstrong | 285/149 |

Primary Examiner—Laramie E. Askin
Attorney, Agent, or Firm—Jack C. Munro

[57] ABSTRACT

A flexible electromagnetic pulse shielding conduit for electrical connectors which is constructed of a backshell to which is threadably secured an end of an elongated convoluted conduit. Located concentrically about the convoluted conduit are different braided layers of electrically conductive material. This electrically conductive material is fixedly secured to a portion of the backshell by shrinking a metallic band disposed thereabout through the use of magnetic pulse forming. A rubber sleeve is located about the layers of electrically conductive material with an end of the rubber sleeve being also fixedly secured to the backshell by use of magnetic pulse forming. Static electricity from the thus formed shielding conduit is to be discharged from the electrically conductive layers through a grounding wire which is conducted through a hole formed in the backshell then through the internal chamber of the backshell and exteriorly thereof.

3 Claims, 4 Drawing Figures

FLEXIBLE ELECTROMAGNETIC PULSE SHIELDING CONDUIT

BACKGROUND OF THE INVENTION

The field of this invention relates to a new and improved construction of a flexible electromagnetic pulse shielding conduit for electrical conductors.

In the past, it has been common to encase electrical conductors that extend from one location to another. The conducting of electrical conductors is required for operating electrical "equipment" remote from the source of the electrical generating signal apparatus. A typical location of where a substantial number of electrical conductors are utilized to operate remote equipment would be within an aircraft or other vehicles.

In the past, it has been common to principally shield the electrical conductors from moisture. When dealing with military equipment and particularly when dealing with the electrical conductors that operate critical equipment, it also has been necessary to protect the conductors from exterior electrical disturbances. Common forms of exterior electrical disturbances are electromagnetic interference and radio frequency interference. It has been common in the past to construct shielding conduits to protect electrical conductors from such types of interference.

However, there is another type of interference to which electrical conductors are susceptible, and that is termed "electromagnetic pulse". An electromagnetic pulse comes from sources such as a nuclear detonation. It has been found that even the detonation of a relatively small sized nuclear weapon that is strategically placed within the atmosphere can cause an extensive amount of damage to electronic equipment. This damage manifests itself in two effects. The first effect is hardware damage, usually in the form of semiconductor burnout. The second effect is electronic upset, ususally in the form of data transmission loss, or loss of stored data.

An electrical conductor may be shielded against electromagnetic and radio frequency interference, but not be shielded against electromagnetic pulse. This pulse, when picked up by the electrical conductors, is conducted into the electronic equipment. Any small aperture within a shielded electrical conductor conduit would provide for access of the pulse to the electrical conductor.

In the past, in order to prevent this superimposing of signals onto an electrical conductor, it has been common to encase the electrical conductor within a conduit formed of layers of braided metallic wires. In the constructing of such conduits in the past, it has been common to use clamps and other similar types of mechanical fastening devices in order to secure the ends of these layers of braided wires to the electrical connector fitting (such as backshells). However, it has been found that over a period of time and during installation of these conduits, these mechanical connections become loosened, resulting in the forming of small openings within the conduit. Any small opening within any conduit will make such conduit ineffective against protection of electromagnetic pulse. A single unprotected conduit within a bomber or fighter aircraft, that is exposed even minorly to a nuclear explosion, will result in that aircraft becoming immediately inoperative.

One type of method of connection between parts is called magnetic pulse forming. Magnetic pulse forming machines were first introduced in 1962. Since that time, magnetic pulse forming machines have been utilized to assemble a variety of manufactured articles which would be difficult and costly to assemble by conventional methods.

Magnetic pulse forming is an assembly technique which utilizes a high intensity magnetic field to expand or contract metallic workpieces. Magnetic pulse forming is based on the interaction of a rapidly changing magnetic field and the currents induced in an electrically conductive workpiece. Magnetic pulse forming is capable of compressing or expanding metal members without direct physical contact and without lubricants or torque normally encountered in rolling and spinning operations.

The high flux densities necessary to perform such magnetic pulse forming can be produced by discharging a capacitor through a coil for a period of a few microseconds. Thus, tremendous flux densities are produced for a short period of time. It is the magnetic force which moves the metal. In the case of a ring or band and this magnetic pulse being applied exteriorly thereof, this ring or band will in essence shrink and enclose a smaller area. This closing technique can be utilized to achieve an extremely strong, secure connection between different parts of a manufactured product.

SUMMARY OF THE INVENTION

The structure of the present invention relates to the construction of an elongated flexible walled conduit through which is to be conducted one or more electrical conductors. Each end of the conduit terminates in a fitting which is frequently termed a backshell. A backshell is to achieve a physically tight connection to the device to which the electrical conductor is connected as well as provide the necessary electrical connection. The conduit is constructed of an innermost member which comprises a plastic convoluted tube. An end of this convoluted tube is attached to a threaded portion formed on the inner end of the backshell. Located about the plastic tube are one or more layers of braided metallic wires. One layer is to be constructed of a phosphor bronze braiding and the other layer is to be constructed of a tin/copper braiding. However, other types of braiding could be used such as nickel/copper. These overlapped layers of braided wires are secured directly to a portion of the backshell by means of magnetic pulse forming a shrinkable band about the layers of braided wires tightly binding such directly onto the backshell. An electrical conducting ground wire may be conducted into the internal chamber of the backshell through a hole in the side wall of the backshell and then in direct contact with the layers of braided wires and thus also connected to a ground pin in the electrical device (not shown) when required. This locating of the ground wire is accomplished prior to the magnetic pulse forming operation. The layers of braided wires are then covered by an outer jacket to protect the overall assembly from moisture. A desirable material for the outer jacket would be a neoprene rubber. The neoprene rubber jacket is also similarly secured to the backshell through the use of the magnetic pulse forming technique.

DETAILED DESCRIPTION OF THE SHOWN EMBODIMENT

Figure 1:
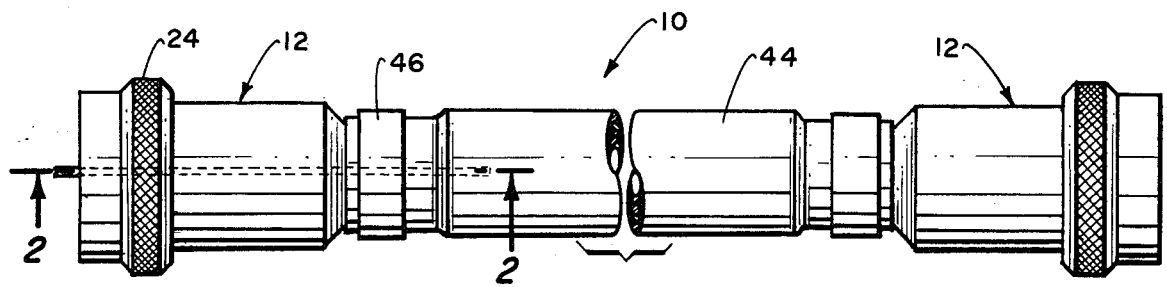
FIG. 1 is an elevational view showing a typical conduit constructed in accordance with this invention, showing the conduit broken between the ends thereof.
Figure 2:
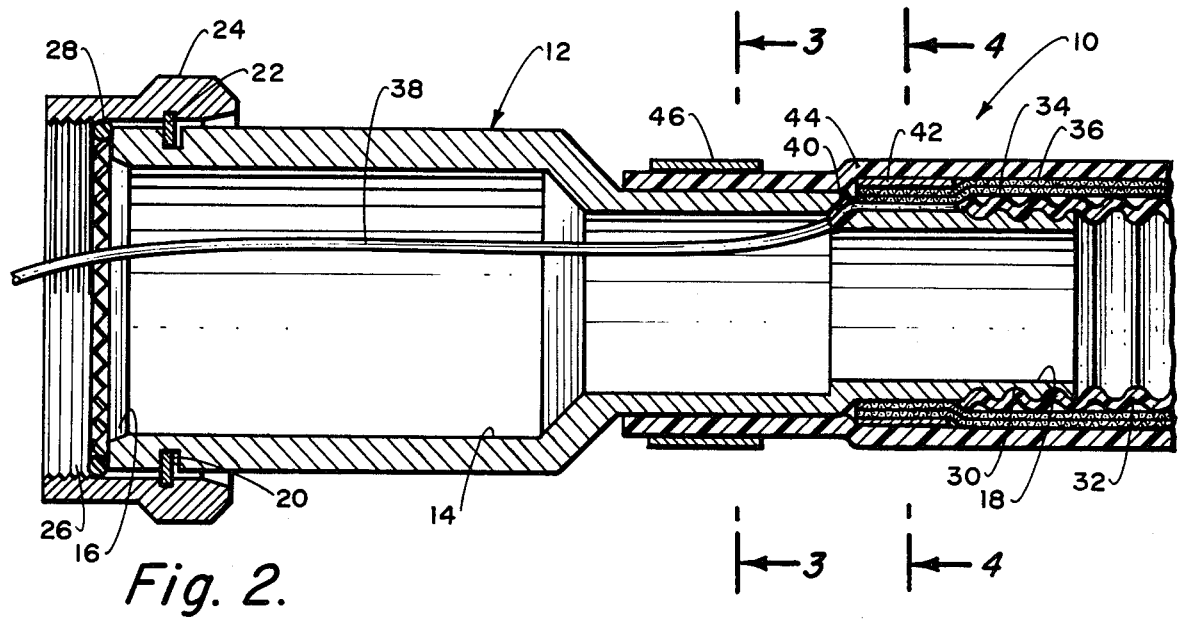
FIG. 2 is a cross-sectional view taken along line 2—2 of FIG. 1 showing in detail the attachments to the backshell.
Figure 3:
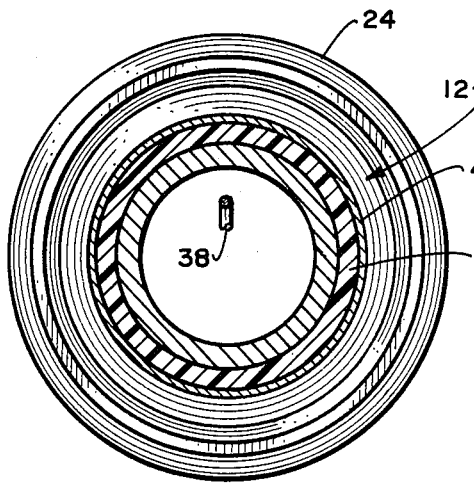
FIG. 3 is a cross-sectional view through a portion of the conduit taken along line 3—3 of FIG. 2.
Figure 4:
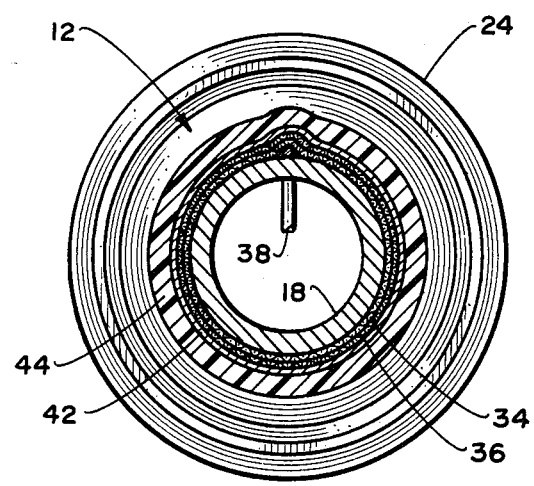
FIG. 4 is a cross-sectional view taken along line 4—4 of FIG. 2.

Referring particularly to the drawing, there is shown the conduit 10 of this invention which can be constructed to be of any desirable length. Conduit 10 of this invention can be customed designed, or can be constructed in different "off the shelf" lengths. Conduit 10 will terminate at each end in a fitting which is commonly referred to as a backshell 12.

The backshell 12 is formed of a metallic member having an internal chamber 14. The outer end 16 and the inner end 18 of the chamber 14 are open. Formed in the exterior surface of the backshell 12 in the area of the outer end 16 is a groove 20. Within the groove 20 is located a ring 22. This ring 22 is mounted within the interior surface of a connecting sleeve 24. The outer end of the connecting sleeve is interiorly threaded at 26. Between the threads 26 and the outer end 16 of the backshell 12 is an O-ring sealing member 28. Threads 26 are to connect with an appropriate threaded connection of an electronic device (not shown) and tightened to form a positive totally enclosing secure connection therebetween.

The exterior surface of the inner end 18 of the backshell 12 includes a threaded portion 30. This threaded portion 30 is to threadingly engage with an end of a convoluted plastic tube 32. This tube 32 is tightly secured through the threaded connection to the backshell 12. Tube 32 will be constructed of a plastic material so as to permit flexibility so that the conduit 10 can be bent.

Concentrically disposed about the tube 32 is a layer 34 of a tin/copper braiding. This braiding is to be tightly woven forming a tightly interwined tubular member. Located about the layer 34 is a PHOSPHOR BRONZE braiding layer 36. Layer 36 closely conforms about the layer 34 and is identical in length.

An electrical conducting wire 38 is conducted through the open end 16 of the backshell 12 and is conducted through hole 40 formed through the wall of the backshell 12. The end of the electrical conductor 38 is then located against a portion of the exterior surface of the backshell and interiorly of the layer 34. A band 42 is then located about the layer 36 in juxtaposition with the end of the electrical conductor 38. This band is then placed within the high intensity magnetic field of a magnetic pulse forming machine (not shown) and when subjected to this magnetic force, the band 42 is shrunk tightly onto the backshell 12 tightly binding layers 34 and 36 to the backshell 12. As a result, an extremely solid intregal connection is obtained. Static electricity from the conduit 10 is conducted through the electrically conductive layers 34 and 36 to the electrical conductor 38 and is hence discharged from the electrical conductor 38 to an appropriate electrical grounding connection (not shown).

It is now desirable to enclose the conduit 10 within a protective sleeve or jacket 44 to prevent moisture from coming into contact with the layers 34 and 36. A typical material of construction for the sleeve 44 would be neoprene rubber. The end of the sleeve 44 also abuts against a portion of the backshell 12. This sleeve 44 is fixedly secured to the backshell 12 through the use of a band 46 which is similar to the band 42 and is shrunk in the same manner. The function of the rubber jacket 44 is not only to protect the layers 34 and 36 against contamination by moisture, but also to provide a comfortable exterior surface so that the conduit 10 can be readily grasped by an individual and handled comfortably during its installation.

What is claimed is:

1. A flexible electromagnetic pulse shielding conduit for electrical conductors comprising:

a backshell having an internal open-ended chamber, said backshell having an inner end and an outer end, said outer end being adapted to connect with a separate electrical apparatus, said inner end having an exterior screw-threaded portion;

a thin-walled conduit, said conduit being flexible, said conduit including a series of convolutions, said convolutions of an end of said conduit screw threadingly connecting with said screw-threaded portion of said inner end;

an electrically conductive metallic tube assembly concentrically disposed about said conduit, one end of said tube assembly being in direct contact with said backshell;

a first metallic band located about said one end, said first metallic band being shrunk about said one end and thereby tightly binding said one end to said backshell forming a secure connection therebetween;

said metallic tube assembly comprising a plurality of separate sleeves of braided metallic electrically conductive material;

each said sleeve being constructed of a different metallic material; and a hole formed through the side wall of said backshell, said hole connecting with said internal open-ended chamber, an electrical grounding wire being conducted through said outer end and into said open-ended chamber, said electrical grounding wire being conducted through said hole and connecting with said metallic tube assembly.

2. The flexible electromagnetic pulse shielding conduit as defined in claim 1 including:

a rubber sleeve disposed about said electrically conductive metallic tube assembly, a second metallic band located about said rubber sleeve, said second metallic band being shrunk about said rubber sleeve and thereby tightly binding said rubber sleeve to said backshell forming a secure, moisture proof seal therebetween.

3. A flexible electromagnetic pulse shielding conduit for electrical conductors comprising:

a backshell having an internal open-ended chamber, said backshell having an inner end and an outer end, said outer end being adapted to connect with a separate electrical apparatus, said inner end having an exterior screw-threaded portion;

a thin-walled conduit, said conduit being flexible, said conduit including a series of convolutions, said convolutions of an end of said conduit screw threadingly connecting with said screw-threaded portion of said inner end;

an electrically conductive metallic tube assembly concentrically disposed about said conduit, one end of said tube assembly being in direct contact with said backshell;

a first metallic band located about said one end, said first metallic band being shrunk about said one end and thereby tightly binding said one end to said backshell forming a secure connection therebetween;

a rubber sleeve disposed about said electrically conductive metallic tube assembly, a second metallic band located about said rubber sleeve, said second metallic band being shrunk about said rubber sleeve and thereby tightly binding said rubber sleeve to said backshell forming a secure, moisture proof seal therebetween; and said second metallic band being longitudinally spaced from said first metallic band, said second metallic band being located nearer said outer end than said first metallic band, whereby said rubber sleeve completely encloses said tube assembly and said first metallic band.

* * * * *